United States Patent
Dispenza et al.

(10) Patent No.: US 11,880,914 B2
(45) Date of Patent: Jan. 23, 2024

(54) RECONSTRUCTION OF MR IMAGES BY MEANS OF WAVE-CAIPI

(71) Applicant: Siemens Healthcare GmbH, Erlangen (DE)

(72) Inventors: Nadine Dispenza, Erlangen (DE); Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 437 days.

(21) Appl. No.: 17/240,069

(22) Filed: Apr. 26, 2021

(65) Prior Publication Data

US 2021/0350592 A1   Nov. 11, 2021

(30) Foreign Application Priority Data

May 5, 2020  (DE) .................... 10 2020 205 667.6

(51) Int. Cl.
| | |
|---|---|
| *G06T 11/00* | (2006.01) |
| *G01R 33/565* | (2006.01) |
| *G01R 33/56* | (2006.01) |

(52) U.S. Cl.
CPC ........ *G06T 11/005* (2013.01); *G01R 33/5608* (2013.01); *G01R 33/56509* (2013.01); *G06T 2210/41* (2013.01)

(58) Field of Classification Search
CPC ..... A61B 5/1121; A61B 5/702; G01R 33/283; G06T 7/74; A61T 7/248
See application file for complete search history.

(56) References Cited

U.S. PATENT DOCUMENTS

| 6,894,494 B2 * | 5/2005 | Stergiopoulos .... | G01R 33/5673 324/309 |
| 7,482,806 B2 * | 1/2009 | Stemmer ............ | G01R 33/5617 324/307 |

(Continued)

FOREIGN PATENT DOCUMENTS

DE     102018218471 B3    2/2020

OTHER PUBLICATIONS

Bilgic Berkin e.al.; Wave-CAIPI for Highly Accelerated 3D Imaging; Full Paper; Wiley Periodicals, Inc.; 2014. pp. 1-11.

(Continued)

*Primary Examiner* — Yosef Kassa
(74) *Attorney, Agent, or Firm* — Lempia Summerfield Katz LLC

(57) ABSTRACT

A method serves for MR-based reconstruction of images of a patient. Whether a value of a movement of the patient in at least one motion direction during an MR scan exceeds a respective threshold value is monitored. If this is not the case, an image reconstruction is performed by a Wave-CAIPI method on the basis of identical calibrated PSF subfunctions for all k-space lines. When this is the case, a number of bins are provided that correspond to sequential value ranges of the patient movement in at least one motion direction, the k-space lines are assigned to the bins based on a movement value determined during their respective acquisition, a calibration of PSF subfunctions is performed for at least two bins on the basis of the k-space lines assigned to said bins, and an image reconstruction is performed by a Wave-CAIPI method in such a way that the PSF subfunctions associated with the assigned bins are used for the respective k-space lines.

17 Claims, 3 Drawing Sheets

(56) References Cited

U.S. PATENT DOCUMENTS

| | | | |
|---|---|---|---|
| 9,429,637 B2* | 8/2016 | Krueger | A61B 5/064 |
| 9,717,461 B2* | 8/2017 | Yu | A61B 5/1121 |
| 9,734,589 B2* | 8/2017 | Yu | G06T 7/248 |
| 9,753,111 B2* | 9/2017 | Forthmann | G01G 19/44 |
| 10,408,910 B2* | 9/2019 | Cauley | G01R 33/5616 |
| 2018/0143277 A1 | 5/2018 | Chen et al. | |
| 2020/0132795 A1 | 4/2020 | Beck et al. | |
| 2022/0099779 A1 | 3/2022 | Zeller | |

OTHER PUBLICATIONS

Breuer, Felix et al.: "Controlled Aliasing in Parallel Imaging Results in Higher Acceleration (CAIPIRINHA)", in: Magnetom Flash Jan. 2012; 2012. pp. 135-142.

Cauley Stephen F. et al.; Autocalibrated Wave-CAIPI Reconstruction, Joint Optimization of k-Space Trajectory and Parallel Imaging Reconstruction; International Society for Magnetic Resonance in Medicine; 2016. pp. 1-7.

Chen, Feiyu, et al. "Autocalibrating motion-corrected wave-encoding for highly accelerated free-breathing abdominal MRI." Magnetic resonance in medicine 78.5 (2017): 1757-1766.

German Office Action for German Application No. 10 2020 205 667.6 dated Feb. 11, 2021.

Polak, Daniel, et al. "Highly-accelerated volumetric brain examination using optimized wave-CAIPI encoding." Journal of Magnetic Resonance Imaging 50.3 (2019): 961-974.

* cited by examiner

RECONSTRUCTION OF MR IMAGES BY MEANS OF WAVE-CAIPI

RELATED CASE

This application claims the benefit of German Application 102020205667.6, filed on May 5, 2020, which is hereby incorporated by reference in its entirety.

FIELD

The present embodiments relate to a method for magnetic resonance (MR)-based reconstruction of images of a patient, wherein an image reconstruction is performed by a Wave-Controlled Aliasing in Parallel Imaging (CAIPI) technique based on identical calibrated PSF subfunctions for all k-space lines. An MR system is configured to perform the method.

BACKGROUND

In the field of medical technology, imaging by magnetic resonance (MR), also known as magnetic resonance tomography (MRT) or magnetic resonance imaging (MRI), is characterized by high soft-tissue contrasts. In this process, radiofrequency excitation pulses are transmitted into a patient during an MR scan with the aid of an MR device. As a result, magnetic resonance signals are triggered in the patient. The magnetic resonance signals are received as measurement data, for example in the form of k-space lines, by one or more MR antennas and used for reconstructing images.

Various MR scanning methods are known. For example, a brief introduction to the so-called CAIPIRINHA scanning method is provided by F. Breuer et al., "Controlled Aliasing in Parallel Imaging Results in Higher Acceleration (CAIPIRINHA)" MAGNETOM Flash 1/2012, pages 135 to 142.

B. Bilgic et al., "Wave-CAIPI for Highly Accelerated 3D Imaging", Magnetic Resonance in Medicine 73: 2152-2162 (2015) and Stephen F. Cauley et al., "Autocalibrated Wave-CAIPI Reconstruction; Joint Optimization of k-Space Trajectory and Parallel Imaging Reconstruction", Magnetic Resonance in Medicine 78: 1093-1099 (2017), describe the so-called "Wave-CAIPI" technique, which enables higher acceleration factors compared to other parallel imaging techniques by using coil sensitivity profiles in all spatial directions during an image reconstruction process. This spreading is achieved by taking into account modulated phase encoding gradient waveforms during the readout gradient (see e.g. Cauley, FIG. 1a).

The effect of these so-called wave gradients on a magnetization m at a spatial location (x, y, z) can be described as a multiplication with a point spread function (PSF), in particular a wave point spread function, P, e.g. in the hybrid $k_x$-y-z-space as:

$$\text{wave}(x,y,z) = F_x^{-1} P[k_x,y,z] (F_x m[x,y,z]).$$

see analogously e.g., also Bilgic, Formula [8]. Wave(x, y, z) can be referred to as a "wave function" or "wave trajectory". Here, $F_x^{-1}$ and $F_x$ represent an inverse or a forward-directed Fourier transform. The PSF function $P(k_x, y, z)$ describes the effect of sine/cosine wave gradients on the image phase in $k_x$, i.e., the coordinate in the k-space in the x-direction, which is proportional to the readout time point (see e.g. Cauley, FIG. 2a).

According to Daniel Polak et al.: "Highly-Accelerated Volumetric Brain Examination Using Optimized Wave-CAIPI Encoding", J. Magn. Reson. Imaging; 2019; vol. 50; pages 961 to 974, the wave function can be written even more generally as $$\text{wave}_1(x,y,z) = M \Sigma_{\hat{x}} P[\hat{x},x,y,z] Cim[x-\hat{x},y,z]$$

$$q \cdot v. \qquad \text{Eq. (2).}$$

where $P(k_x, y, z)$ can be subdivided for example into a y component $P_y = P(k_x, y)$ and a z component $P_z = P(k_x, z)$. These "PSF subfunctions" $P_y$ and $P_z$ are typically present in the form of matrices which form the PSF function $P(k_x, y, z)$ through multiplication. For image reconstruction purposes, the PSF subfunctions $P_y$ and $P_z$ are often applied according to the above method to the k-space lines or k-space trajectories obtained by means of the MR scan. However, P can also be split up into other components.

Furthermore, alias wave acquisitions can be unaliased by solving a so-called SENSE problem, e.g., as described in Bilgic et al. Ideally, the PSF subfunctions $P_y$ and $P_z$ should in this case be sine- or cosine-shaped, which, following the Fourier transform, leads to a modulation transfer function (MTF) having only one frequency component. In practice, however, the frequency spectrum of $P_y$ and $P_z$ is expanded on account of deviations from an ideal gradient path, e.g., due to eddy currents, gradient delays, etc. An image reconstruction using the "ideal" $P_y$ and $P_z$ then disadvantageously leads to blurring or a lack of sharpness in the resulting image.

For this reason, optimized or "actual" PSF subfunctions $P_y$ and $P_z$ are advantageously determined prior to the image reconstruction by performing calibration measurements before the actual MR scan in order to establish the optimized PSF subfunctions therefrom. In Bilgic et al., the PSF subfunctions $P_y$ and $P_z$ are determined for this purpose by means of three reference scans: by a scan in which all wave gradients are turned off, a scan in which only the PSF subfunction $P_y$ is turned on, and a scan in which only the PSF subfunction $P_z$ is turned on.

In order to determine the PSF subfunctions, it is proposed in DE102018218471B3 to measure a central k-space line with and without wave encoding outside of the isocenter in each case in the direction of the orthogonal spatial direction and from this to interpolate the PSF subfunctions.

Cauley et al. have developed an iterative approach for automatic calibration in which the frequency parameters of $P_y$ and $P_z$ are varied and the result of the image reconstruction is measured at several test sites by calculating the root mean square error (RMSE). If the RMSE approaches a local minimum, it is assumed that the most effectively optimized PSF subfunctions $P_y$ and $P_z$ have been found. The thus optimized PSF subfunctions $P_y$ and $P_z$ are then applied to all k-space lines used for the image reconstruction.

The above-described calibration types deliver consistent results if the patient does not move. In principle, these approaches as well as all other approaches for determining optimal PSF subfunctions can be combined with the method described in the following, where they are referred to as "PSF calibration".

However, as soon as the Wave-CAIPI method using PSF calibration is combined with a prospective motion correction method, such as, e.g., a camera- or navigator-based method, it proves inadequate. This is because prospective motion correction methods compensate for the patient motion by: (a) adjusting the receive and transmit frequencies in order to compensate for a translational movement of the patient, and (b) rotating the relative gradient amplitudes in order to compensate for rotational movements of the patient. The latter motion in particular affects the wave reconstruction, since the PSF subfunctions, e.g., $P_y$ and $P_z$, are dependent on the absolute gradient amplitudes and orientations. Unwanted image artifacts can disadvantageously be generated as a result.

SUMMARY AND DETAILED DESCRIPTION

It is the object to overcome the disadvantages of the prior art at least to some degree and in particular to enable patient movements to be taken into account when a Wave-CAIPI method is applied and in particular to reduce image artifacts caused by a patient movement.

This object is achieved according to the methods and MR systems of the embodiments. Preferred embodiment variants may be derived.

A method is provided for MR-based reconstruction of images of a patient. Whether a value of a movement of the patient in at least one motion direction during an MR scan exceeds a respective threshold value is monitored. If this is not the case, an image reconstruction, in particular by a Wave-CAIPI method, is performed on the basis of identical calibrated PSF subfunctions for all k-space lines. When this is the case, a number of bins are provided which correspond to sequential value ranges of the patient movement in at least one motion direction, the k-space lines are assigned to the bins based on a movement value determined during their respective acquisition, a PSF calibration is performed in each case for at least two bins on the basis of the k-space lines assigned to said bins, and an image reconstruction is performed, in particular by a Wave-CAIPI method, in such a way that the PSF subfunctions associated with the assigned bins are used for the respective k-space lines.

The particular advantage that can be achieved in this way is that a Wave-CAIPI method using PSF calibration can be combined with predictive motion correction and as a result an improvement in the image quality of the reconstructed image is achievable even in the case of patients making stronger movements. Furthermore, the above method can be realized with a limited amount of computational overhead.

The method can serve for the acquisition of at least one image ("MR image") of a patient ("MR acquisition" or "MR scan") based on the principle of magnetic resonance tomography by an MR device.

Monitoring whether a value of a movement of the patient in at least one motion direction during an MR scan exceeds a respective threshold value may include checking already during the MR scan (e.g., in real time) whether the at least one threshold value is exceeded. Alternatively, the MR scan may be performed first and only then a check carried out to determine whether the at least one threshold value has been exceeded. In both cases, it is advantageous if the determined (e.g. measured) movement data is stored with links to the corresponding k-space lines.

The monitoring of the value of the patient movement is effected by any generally known methods, e.g., by at least one optical sensor (e.g. a camera, IR sensors, etc.) and/or by a navigator-based method.

The patient movement may have been prompted by, e.g., a respiratory displacement, coughing, a ticklish sensation, a phobic response, etc.

The value may be, in particular, an absolute value or a direction-dependent value.

Threshold values for different motion directions can be the same or different. They can be different, in particular, in order to take account of different effects of movements in different motion directions on the Wave-CAIPI method.

A bin may be, in particular, a data group and/or a data class. By "binning" may be understood in particular an assignment of k-space lines to one or more bins.

In a development, monitoring whether a value of a movement of the patient in at least one motion direction exceeds a respective threshold value may include branching to the bin-dependent PSF calibration even when only one threshold value is reached or exceeded. Another development may include branching to the bin-dependent PSF calibration only when a number of threshold values are reached or exceeded, in particular when these are reached or exceeded simultaneously. Yet another development may include branching to the bin-dependent PSF calibration when a value calculated from values belonging to a number of motion directions reaches or exceeds the associated threshold value.

In a development, the reference point for the value of the movement is the position of the patient assumed at the start of the MR scan, not his or her position at the start of the acquisition of the k-space line. In this development, the value of the movement therefore corresponds, in particular, to the difference value relative to the initial value at the start of the MR scan. In another development, the value of the movement corresponds to the value during the acquisition of the k-space line, i.e., in particular to the difference value relative to the initial value at the start of the acquisition of said k-space line.

The value of the movement may correspond to a maximum value during the acquisition of a k-space line. Alternatively, the value of the movement may correspond to an average value during the acquisition of a k-space line.

The respective threshold values are typically chosen such that when they are not all reached (i.e. the patient has moved only a little), the effect of the prospective motion correction on the Wave-CAIPI method using PSF calibration is sufficiently minor. In this case, a conventional generally known image reconstruction is performed by the Wave-CAIPI method using PSF calibration. This includes, in particular, utilizing the PSF calibration to calculate PSF subfunctions, which are applied in the following Wave-CAIPI method to all the k-space lines used for the image reconstruction.

If, on the other hand, the movement value of the patient reaches or exceeds the threshold value in at least one motion direction (i.e. the patient movement has been more pronounced in at least one motion direction), the k-space lines or trajectories are assigned to one of the bins in accordance with the movement value detected during their acquisition, a PSF calibration is then performed for at least one of the bins and subsequently the Wave-CAIPI method is performed in such a way that PSF subfunctions determined on a bin-dependent basis are applied to the k-space lines associated with the respective bin. In other words, the Wave-CAIPI method is applied essentially as previously to the k-space lines, though with the difference that the PSF subfunctions used for a specific k-space line were determined beforehand on the basis of the bin to which said k-space line was assigned.

That the bins correspond at least in one motion direction to sequential value ranges includes, in particular, that the value ranges succeed one another in an unbroken sequence. Advantageously, the assignment of the k-space lines to the bins is also unique, i.e., each k-space line is assignable to precisely one bin. Advantageously, therefore, the value ranges of the bins do not overlap, which may also be expressed in terms of the bins having disjoint value ranges.

The (value) width and/or number of the bins for a motion direction may in principle be set arbitrarily. It can be set for example on the basis of the maximum value of the movement in a specific motion direction: the greater this maximum value is, the greater the width and/or the higher the number of bins can become. It is a development that the width of the bins is constant and in particular predefined for a motion direction. The number N of the bins for a motion direction is then yielded from the quotient of the maximum value divided by the predefined width of the bins. Conversely, if the number N of the bins for a motion direction is predefined, then the width of the bins is yielded from the quotient of the maximum value divided by N. However, the bins for a motion direction may also have a variable width.

In one embodiment, the movement in at least one motion direction includes a rotational movement around at least one spatial axis, in particular body axis. Thus, the rotational movement may correspond to a rotation $\Delta\theta_x$ around the transverse axis x, a rotation $\Delta\theta_y$ around the sagittal axis y, and/or a rotation $\Delta\theta_z$ around the longitudinal axis z. Each of the rotational movements may be assigned a respective threshold value $T\theta_x$, $T\theta_y$ or $T\theta_y$, at least two of which may be different.

Each of the translational movements $\Delta x$, $\Delta y$ and/or $\Delta z$ may be assigned a respective threshold value Tx, Ty or Tz, at least two of which may be different.

In an additional or alternative embodiment, the movement in at least one motion direction includes a translational movement along at least one spatial axis. The spatial axis may be in particular a body axis of the patient, such that the translational movement is, e.g., a translational movement $\Delta x$ along his or her transverse axis x, a translational movement $\Delta y$ along his or her sagittal axis y, and/or a translational movement $\Delta z$ along his or her longitudinal axis z.

The use of Cartesian spatial axes produces the advantage that they are oriented orthogonally to one another. In principle, however, other coordinate systems may also be used, in particular a polar coordinate system $\{z, r, \theta_z\}$, e.g., with a translational movement $\Delta z$ along the long axis (in particular longitudinal axis) z, a rotation $\Delta\theta_z$ around the longitudinal axis z, and/or a translational movement $\Delta r$ along the radial direction.

Generally, at least one motion direction that is used for monitoring the patient movement during the MR scan may correspond to at least one motion direction for which the bins are provided. This may be the case, e.g., during monitoring for a translational movement $\Delta z$ along the longitudinal axis z of the patient. Bins may then be provided that differentiate at least two value ranges in the z-direction.

Alternatively or in addition, at least one motion direction that is used for monitoring the patient movement during the MR scan may be different from at least one motion direction for which the bins are provided. For example, a monitoring of the patient movement during the MR scan may be established on the basis of the rotation $\Delta\theta_z$ around the longitudinal axis z of the patient, while the bins provided for taking said rotation into account differentiate the movement in the x- and y-direction. In this case, use is made of the knowledge that the rotation $\Delta\theta_z$ can be unequivocally converted into translational movements $\Delta x$ and $\Delta y$. The movement of the patient is therefore expressed or taken into account only in different coordinate systems when monitoring during the MR scan and when providing the bins.

In an embodiment, a bin includes a value range in which the value of the patient movement in the at least one motion direction lies consistently below the respective threshold value. In other words, in the case of the k-space lines assigned to said bin, the threshold value has not been reached or exceeded for any of the motion directions considered. As a result, this embodiment advantageously also takes specifically into account such k-space lines during whose acquisition the patient made no significant movement. This bin may also be referred to as the "neutral bin".

In another embodiment, a number of bins having sequential value ranges are provided only for such motion directions in which the movement of the patient has exceeded the associated threshold value. This enables a reduction in the computational overhead required to perform the PSF calibrations.

It is an advantageous embodiment for achieving a particularly high image quality that a PSF calibration is performed in each case for all the bins.

In one embodiment, a PSF calibration is performed in each case for only some of the bins and the PSF subfunctions of the remaining bins are interpolated or extrapolated from the iteratively calibrated PSF subfunctions. This enables a reduction in the computational overhead required to obtain optimized PSF subfunctions for all bins, since an interpolation or extrapolation requires a much lower computational overhead than the iterative PSF calibration. The interpolation or extrapolation may include or be, e.g., a linear interpolation.

In another embodiment, at least two of the bins for which an iterative PSF calibration is performed are bins whose associated motion directions are oriented orthogonally to one another. This simplifies the interpolation or extrapolation of the PSF subfunctions of other bins, for example as a result of the fact that the PSF subfunctions of the other bins can be determined by linear combination from the PSF subfunction calculated by PSF calibration. Orthogonal motion directions include, for example, translational movements along the axes of a Cartesian coordinate system, translational and rotational movements along or around the same axis, etc.

In other words, the optimized PSF subfunctions for the respective bins can be obtained either by respective PSF calibration for all bins or by PSF calibration for at least two bins and interpolation or extrapolation of the PSF subfunctions of the other bins from the PSF subfunctions of the calibrated bins.

In an embodiment, one of the bins for which a PSF calibration is performed is that bin to which most k-space lines have been assigned. This therefore achieves the advantage that image artifacts can be avoided in a particularly reliable manner. This bin may also be referred to as the "main bin".

It is a development that one of the bins for which a PSF calibration is performed is the neutral bin, because then a "slope" for an extrapolation or interpolation can advantageously be calculated particularly accurately from the difference with respect to the other bins. This likewise achieves the advantage that image artifacts can be avoided in a particularly reliable manner.

By the method according to one or more embodiments, the further advantage is achieved that—in contrast to Bilgic et al.—the reference scans can be performed after the MR imaging. In this case, it is still possible to perform three reference scans, though now their orientation is selected on the basis of the orientation of the main bin (to which most k-space lines have been assigned). This may include in particular that the central coordinate(s) of the main bin is (are) specified as zero coordinate(s) and therefore the main bin is specified as the (new) neutral bin. This yields the advantage that a particularly large number of lines experience a correct PSF calibration.

It is also a development that a check is carried out to determine whether a predefined percentage (e.g. at least 90%) of the k-space lines is present in the main bin (i.e. only a small position scattering has occurred during the MR scan). If this is the case, a conventional CAIPI method without coordinate binning is performed. The zero position may then correspond, e.g., to the averaged position of the k-space lines, to the center of the main bin, etc.

Generally, the above method, which uses motion or coordinate binning, may be applied to all suitable CAIPI methods without coordinate binning.

The object is also achieved by an MR system, wherein the MR system is configured to perform the method as described hereinabove. To that end, it advantageously includes at least one MR device or scanner for performing an MR scan on a patient, a device for determining a movement of the patient during the MR scan, and a data or image processor for image reconstruction by a Wave-CAIPI method using iterative calibration based on the k-space lines resulting from the MR scan.

The MR device may for example include or be a body coil, for example a head coil or a thorax coil, but also any other body coil such as a neck coil, extremity coil, etc.

BRIEF DESCRIPTION OF THE DRAWINGS

The above-described characteristics, features and advantages, as well as the manner in which these are achieved, will become clearer and more readily understandable in connection with the following schematic description of an exemplary embodiment, which is explained in more detail with reference to the drawings, in which.

DETAILED DESCRIPTION

Figure 1:
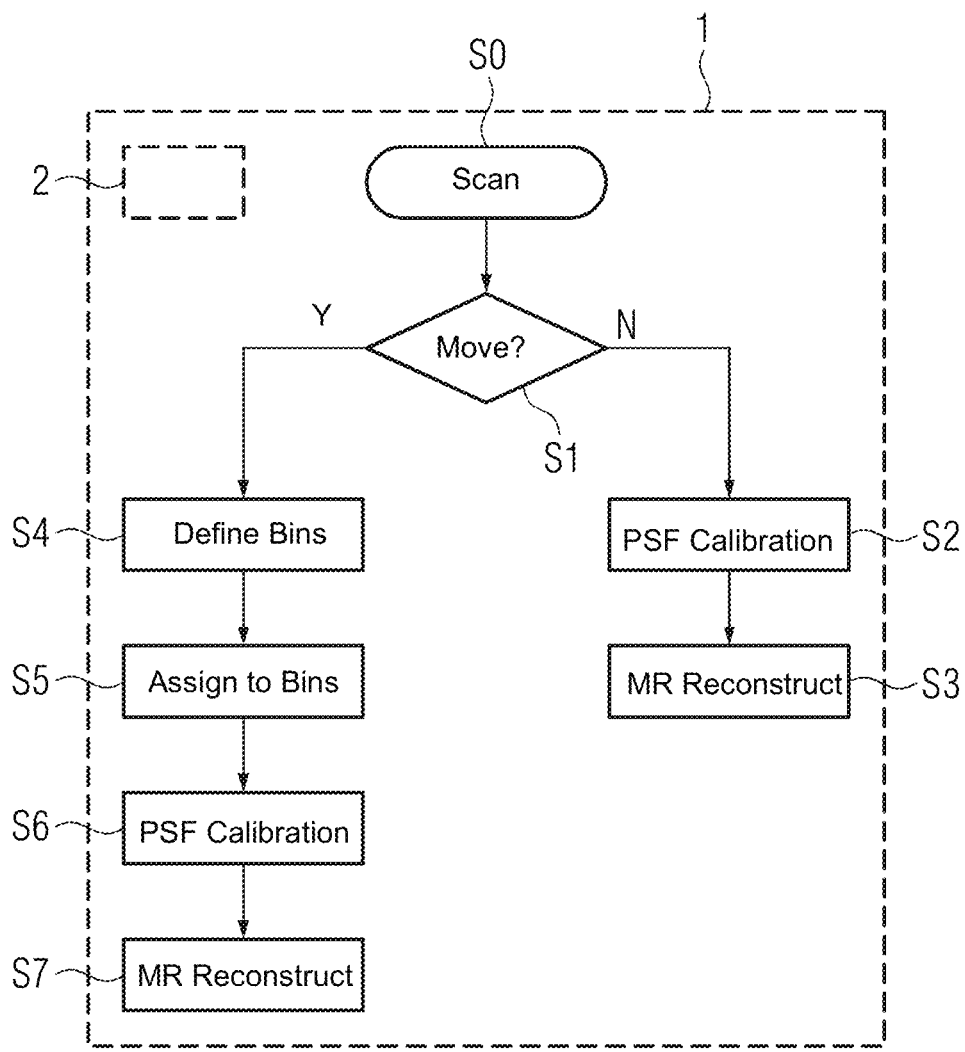
FIG. 1 shows a possible execution sequence of the method according to one embodiment.

FIG. 1 shows a possible execution sequence of a method for MR image reconstruction on the basis of the Wave-CAIPI method with PSF calibration and predictive motion correction.

In a first step S0, an MR scan of a patient is performed by a magnetic resonance tomography system (MR system 1). The MR system 1 is in this case configured in a generally known manner to detect a movement of the patient, for example by at least one optical sensor 2 (e.g. a camera, IR sensors, etc.) and/or by a navigator-based method using the MR system 1. In the process, the patient movements can be detected directly on the patient or indirectly via movements of markers etc. arranged with body coils and/or on the patient. In particular, rotational movements and longitudinal movements of the patient may be detected as movements.

In a step S1, a check is carried out by the MR system 1 (e.g. an associated data processing device, not shown) following completion of the MR scan in order to determine whether an (e.g. absolute) value of a patient movement in at least one motion direction has reached or exceeded an associated threshold value. In the following description, reference is made to a monitoring for a rotation $\Delta\theta_z$ of the patient around his or her longitudinal axis z. This has a particularly marked effect on the PSF calibration. Alternatively or in addition, however, other motion directions may be monitored, e.g., a translation $\Delta z$ along the longitudinal axis z.

If this is not the case ("N") and consequently there has been no or only a slight rotational movement of the patient, a branch is made to steps S2 and S3, which perform a conventional image reconstruction based on the k-space lines derived from the MR scan on the basis of the Wave-CAIPI method with PSF calibration as described e.g. in Bilgic et al. and Cauley et al. This can happen for example such that initially a PSF calibration is performed in step S2 on the basis of all of the k-space lines generated by the MR scan. The set of PSF subfunctions optimized by calibration (e.g. $P_y$ and $P_z$) is available as the result of the PSF calibration. In a following step S3, an MR image is reconstructed by the Wave-CAIPI method using said one set of optimized PSF subfunctions.

However, even if only one value of the rotation $\Delta\theta_z$ of the patient during the MR scan is equal to or greater than the threshold value $T\theta z$ ("Y"), a branch is made to steps S4 to S7.

In step S4, a number of bins are determined or defined to which the k-space lines are uniquely assigned as a function of the value of the rotation $\Delta\theta_z$ of the patient during the MR scan.

Figure 2:
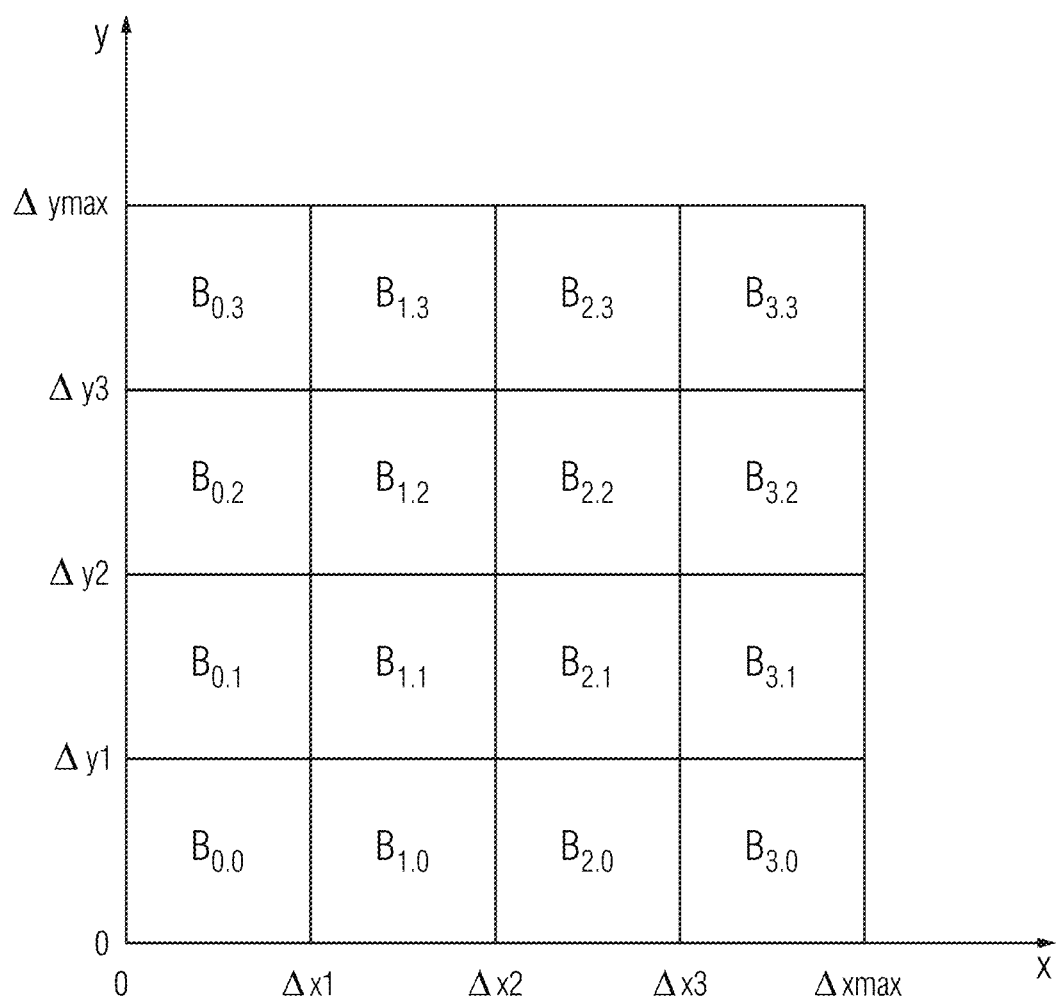
FIG. 2 shows a diagram of a possible binning scheme.

FIG. 2 shows a possible binning scheme for this purpose. This is based on conversion of the values of the rotation $\Delta\theta_z$ of the patient into corresponding values in the Cartesian (x,y) coordinate plane. This results in respective maximum values of the motion $\Delta x_{max}$ and $\Delta y_{max}$ along the x-axis x and the y-axis y. Bins $B_{i,j}$ are then defined as two-dimensional subranges of the surface area in the (x,y) plane inside $\Delta x=[0; \Delta x_{max}]$ and $\Delta y=[0; \Delta y_{max}]$. In the present case, purely by way of example, 16 bins $B_{i,j}$ have been defined with value ranges $i=0, \ldots, 3$ in the x-direction and value ranges $j=0, \ldots, 3$ in the y-direction, i.e. with $N_x=4$ value ranges in the x-direction and $N_y=4$ value ranges in the y-direction. This may also be expressed such that, for y=const., $N_x=4$ bins are provided in the x-direction, and analogously, for x=const., $N_y=4$ bins are provided in the y-direction.

The k-space lines are assigned to these bins $B_{i,j}$ as a function of the values $\Delta x$ and $\Delta y$ determined during their acquisition. If, for example, corresponding Cartesian values $\Delta x$ and $\Delta y$ were calculated from the associated rotation value $\Delta\theta_z$ for a specific k-space line, where said Cartesian values lie in the range $[\Delta x2; \Delta x3[$ or $[\Delta y1; \Delta y2[$, said k-space line is assigned to bin $B_{2,1}$.

Bin $B_{0,0}$ may correspond to the neutral bin but does not need to.

The value ranges of bins $B_{i,j}$ may be of equal width in the x-direction and/or y-direction, but do not need to be. The number $N_x$ may also be chosen differently to the number $N_y$.

Returning to FIG. 1, the k-space lines of the MR scan are assigned to bins $B_{i,j}$ in step S5.

In step S6, a PSF calibration is then performed in each case for all the bins $B_{i,j}$ on the basis of the k-space lines $k_x(B_{i,j})$ assigned to said bins $B_{i,j}$.

In step S7, an image reconstruction is subsequently performed by a Wave-CAIPI method in such a way that the calibrated PSF subfunctions $P_x(B_{i,j})$ and $P_y(B_{i,j})$ calculated for the assigned bins $B_{i,j}$ are used for the respective k-space lines $k_x(B_{i,j})$ or the wave functions referred to them.

Figure 3:
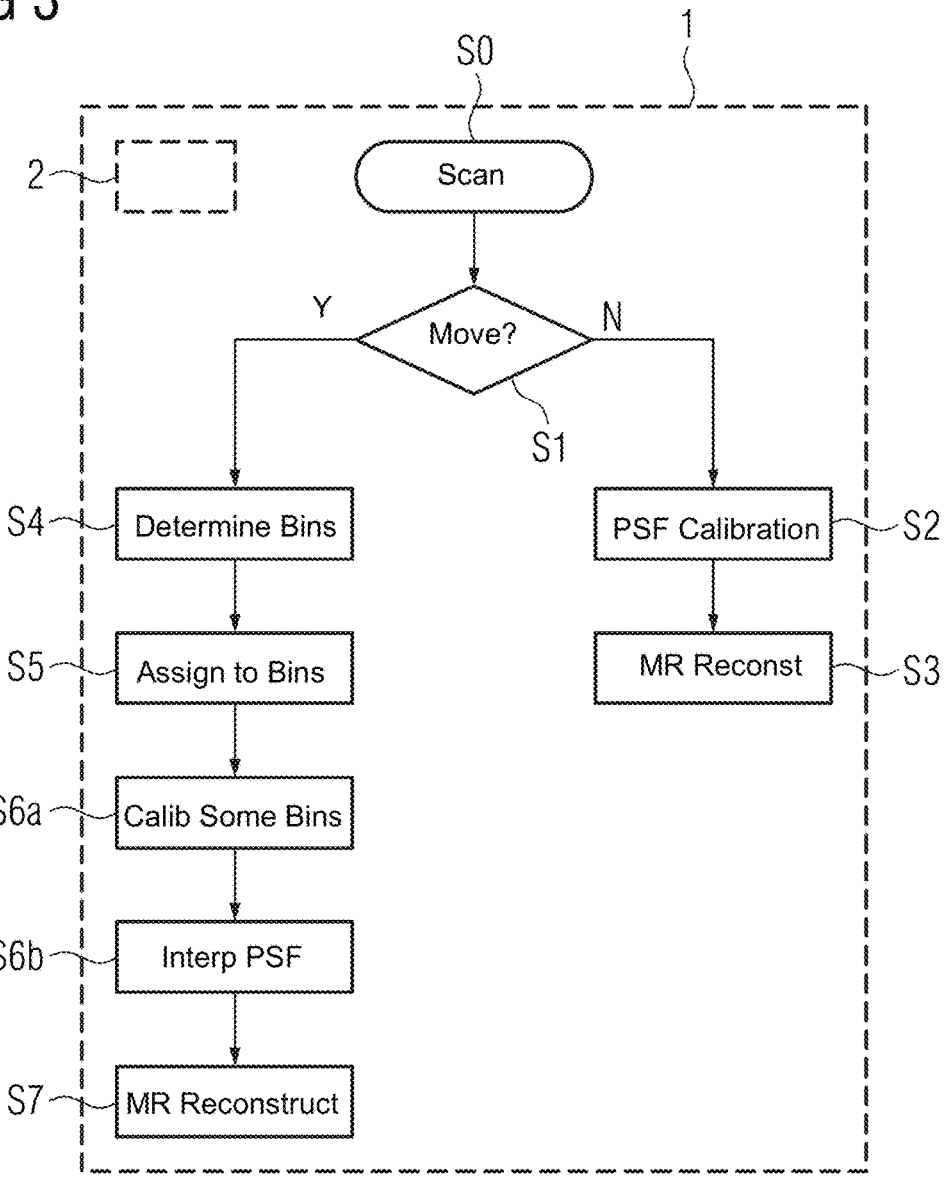
FIG. 3 shows a further possible execution sequence of the method according to one embodiment.

FIG. 3 shows a further possible execution sequence of the method.

In this case, instead of step S6, in which a respective PSF calibration is performed for all the bins a PSF calibration is performed only for some of the bins $B_{i,j}$ in a step S6a, while the PSF subfunctions of the remaining bins $B_{i,j}$ are interpolated or extrapolated therefrom in a step S6b.

Again referred back to FIG. 2, the PSF calibrations can be carried out for example in such a way that they are performed for at least one of the bins $B_{1,0}$, $B_{2,0}$ or $B_{3,0}$ in each case (which include a perceptible movement of the patient practically only along the x-axis) and one of the bins $B_{0,1}$, $B_{0,2}$ or $B_{0,3}$ in each case (which include a perceptible movement of the patient practically only along the y-axis orthogonal thereto). This yields the advantage that optimized PSF subfunctions of the other bins $B_{i,j}$ can be interpolated or extrapolated by simple linear combination from the PSF subfunctions calculated by PSF calibration. However, other bins $B_{i,j}$ may also be used for this purpose, in particular if they do not all have the same index i or j.

However, a respective PSF calibration can also be performed additionally for further of the bins $B_{i,j}$, since in this way the accuracy of the interpolation or extrapolation of the PSF subfunctions can be increased for the other bins $B_{i,j}$.

It is therefore advantageous for an improvement in image quality if a PSF calibration is also performed in step S6a for that bin $B_{i,j}$ that has the most k-space lines.

It may also be advantageous with regard to an improvement in image quality if a PSF calibration is performed in addition or alternatively in step S6a for bin B0A, because then a "slope" for an extrapolation or interpolation in the x- and y-direction can be calculated particularly accurately from the difference with respect to the other bins.

In step S7, an image reconstruction is then subsequently performed by a Wave-CAIPI method in such a way that the (calibrated or interpolated or extrapolated) PSF subfunctions optimized for the assigned bins $B_{i,j}$ are used for the respective k-space lines $k_x(B_{i,j})$.

Figure 4:
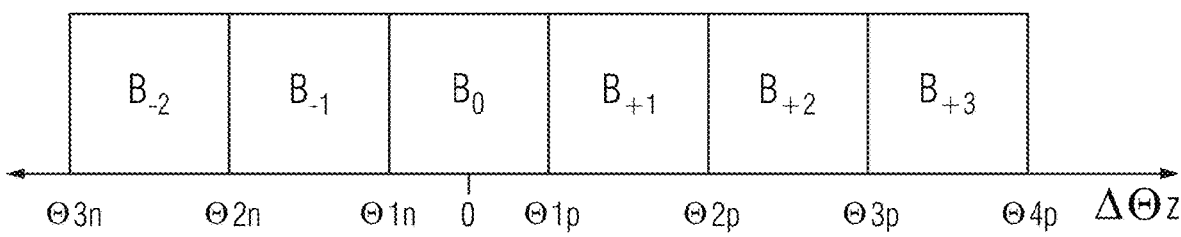
FIG. 4 shows a diagram of a further possible binning scheme.

FIG. 4 shows a diagram of a further possible binning scheme. In this case, the bins are produced only on the basis of the rotation values $\Delta\theta_z=[\theta 3n; \theta 4p]$, which is particularly simple and sufficiently accurate when rotations of the patient have the main impact on the PSF change. Here, by way of example, rotation values θin, where i=1, . . . , 3, denote rotations in the anticlockwise direction and rotation values θjp, where j=1, . . . , 3, denote rotations in the clockwise direction. Values θin and θjp, where i=j, may be the same or different. In the present case, purely by way of example, bin $B_0$ is centered around $\Delta\theta_z=0$. This binning scheme can be used analogously to the binning scheme from FIG. 2.

Although the invention has been illustrated and described in greater detail on the basis of the exemplary embodiments shown, the invention is not limited thereto, and other variations may be derived herefrom by the person skilled in the art without leaving the scope of protection of the invention.

Thus, the above method is not limited generally to the above-described formulation of the wave function or wave trajectory in Cartesian coordinates but may also be applied to non-Cartesian wave functions or wave trajectories provided the conditions cited in Bilgic et al. and Cauley et al. are fulfilled.

The invention claimed is:

1. A method for MR-based reconstruction of images of a patient, the method comprising:
monitoring whether a value of a movement of the patient in at least one motion direction during an MR scan exceeds a respective threshold value;
performing reconstruction with a Wave-CAIPI method on a basis of identical calibrated PSF subfunctions for all k-space lines when the value of the movement of the patient does not exceed the respective threshold value; and
when the value of the movement does exceed the respective threshold value:
providing a number of bins corresponding to sequential value ranges of the patient movement in at least one motion direction,
assigning the k-space lines to the bins based on a value of the movement during the respective acquisition of the k-space line,
performing a calibration of PSF subfunctions for at least two bins on the basis of the k-space lines assigned to said bins, and
reconstructing an image by a Wave-CAIPI method in such a way that the PSF subfunctions associated with the assigned bins are used for the respective k-space lines.

2. The method as claimed in claim 1, wherein the movement in at least one motion direction corresponds to a translational movement along at least one body axis.

3. The method as claimed in claim 1, wherein the movement in at least one motion direction comprises a rotational movement around at least one body axis.

4. The method as claimed in claim 1, wherein a bin of the number of bins comprises a value range in which the value of the movement in the at least one motion direction lies below the respective threshold value.

5. The method as claimed in claim 1, wherein the number of bins have sequential value ranges provided only for such motion directions in which the movement of the patient exceeds the respective threshold value.

6. The method as claimed in claim 1, wherein the PSF calibration is performed in each case for only some of the bins and the PSF subfunctions of the remaining bins are interpolated or extrapolated from the calibrated PSF subfunctions.

7. The method as claimed in claim 6, wherein one of the bins for which an iterative calibration is performed is that bin to which most of the k-space lines have been assigned.

8. The method as claimed in claim 6, wherein at least two of the bins for which a PSF calibration is performed are bins whose associated motion directions are oriented orthogonally to one another.

9. The method as claimed in claim 1, wherein the PSF calibration is performed for all the bins.

10. An MR system comprising:
an MR scanner configured to scan a patient,
a sensor configured to determine a movement of the patient, and
a data processor configured for image reconstruction by a Wave-CAIPI method using iterative calibration based on the k-space lines resulting from the MR scan, the data processor configured to perform the image reconstruction comprising:
(a) performance of the image reconstruction with the Wave-CAIPI method on a basis of identical calibrated PSF subfunctions for all k-space lines when the movement does not exceed a threshold value, and
(b) when the movement does exceed the respective threshold value: provision of a number of bins corresponding to sequential value ranges of the movement in at least one motion direction, assignment of the k-space lines to the bins based on the movement during the respective acquisition of the k-space line, performance of a calibration of PSF subfunctions for at least two bins on the basis of the k-space lines assigned to said bins, and reconstruction by the Wave-CAIPI method in such a way that the PSF subfunctions associated with the assigned bins are used for the respective k-space lines.

11. The MR system as claimed in claim 10, wherein the MR scanner comprises a body coil.

12. The MR system as claimed in claim 10 wherein a bin of the number of bins comprises a value range in which the value of the movement in the at least one motion direction lies below the respective threshold value.

13. The MR system as claimed in claim 10, wherein the number of bins have sequential value ranges provided only for such motion directions in which the movement of the patient exceeds the respective threshold value.

14. The MR system as claimed in claim 10, wherein the data processor is configured to perform the PSF calibration for only some of the bins and the PSF subfunctions of the remaining bins are interpolated or extrapolated from the calibrated PSF subfunctions.

15. The method as claimed in claim 7, wherein at least two of the bins for which a PSF calibration is performed are bins whose associated motion directions are oriented orthogonally to one another.

16. The method as claimed in claim 4, wherein the number of bins have sequential value ranges provided only for such motion directions in which the movement of the patient exceeds the respective threshold value.

17. The method as claimed in claim 16, wherein the PSF calibration is performed in each case for only some of the bins and the PSF subfunctions of the remaining bins are interpolated or extrapolated from the calibrated PSF subfunctions.

* * * * *